US007172454B2

(12) United States Patent
Karkkainen et al.

(10) Patent No.: US 7,172,454 B2
(45) Date of Patent: Feb. 6, 2007

(54) ELECTRONIC COMPONENT ASSEMBLY

(75) Inventors: Tero Kalevi Karkkainen, Halikko (FI); Kalle Salokannel, Salo (FI)

(73) Assignee: Nokia Corporation, Espoo (FI)

( * ) Notice: Subject to any disclaimer, the term of this patent is extended or adjusted under 35 U.S.C. 154(b) by 6 days.

(21) Appl. No.: 11/026,902

(22) Filed: Dec. 30, 2004

(65) Prior Publication Data
US 2006/0148282 A1 Jul. 6, 2006

(51) Int. Cl.
*H01R 12/24* (2006.01)
(52) U.S. Cl. ...................................... 439/492
(58) Field of Classification Search .................. 439/70, 439/492
See application file for complete search history.

(56) References Cited

U.S. PATENT DOCUMENTS

| | | | |
|---|---|---|---|
| 5,049,813 A * | 9/1991 | Van Loan et al. | 439/70 |
| 5,180,976 A * | 1/1993 | Van Loan et al. | 439/70 |
| 5,696,027 A * | 12/1997 | Crane et al. | 438/612 |
| 6,153,929 A * | 11/2000 | Moden et al. | 257/686 |
| 6,884,653 B2 * | 4/2005 | Larson | 438/107 |
| 6,914,324 B2 * | 7/2005 | Rapport et al. | 257/686 |
| 7,081,373 B2 * | 7/2006 | Roeters et al. | 438/109 |

OTHER PUBLICATIONS

New PWB Technology in INTER NEPCON, Dominique Numakura Newsletter from Japan, May 28, 2004, 3 pages, http://www.emsnow.com/newsarchives/archivedetails.crfm?ID=702
Panasonic Printed Wiring Board, Matsushita Electronic Industorial Catalogue, May 28, 2004, 3 pages, http://industrial.panasonic.com/www-ctlg/ctlg/qANB0000_E.html.

* cited by examiner

*Primary Examiner*—Briggitte R. Hammond
(74) *Attorney, Agent, or Firm*—Harrington & Smith, LLP

(57) ABSTRACT

An electronic component assembly including an electrical connector and an electronic subassembly. The electrical connector has a housing with a receiving area, electrical contacts connected to the housing, and fusible elements. The electrical contacts include first electrical connection sections in the receiving area and second electrical connection sections proximate a first exterior side of the housing. The fusible elements are connected to the second electrical connection sections. The electronic subassembly includes a printed wiring assembly and electronic components connected to opposite sides of the printed wiring assembly. The printed wiring assembly includes a relatively rigid section with the electronic components connected thereto and a flex cable forming deflectable lateral side sections with contact areas contacting the first electrical connector sections of the electrical contacts.

6 Claims, 7 Drawing Sheets

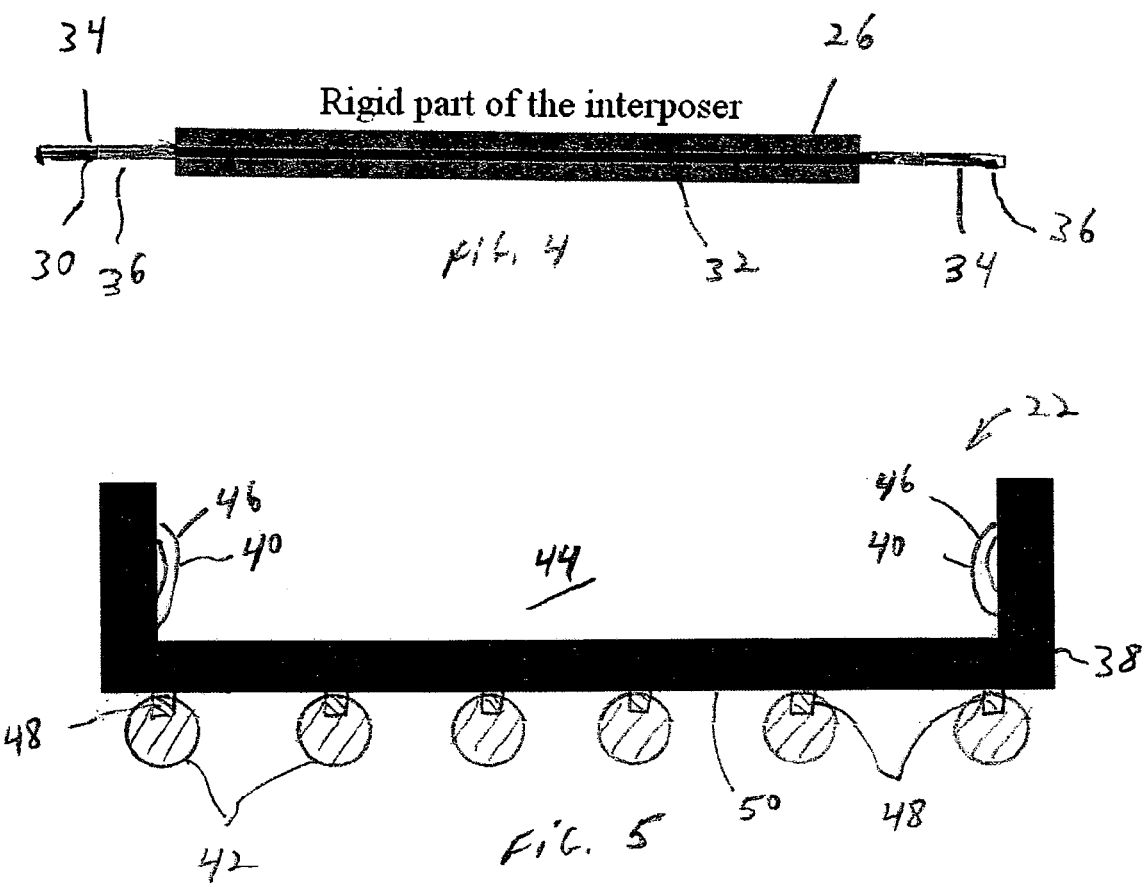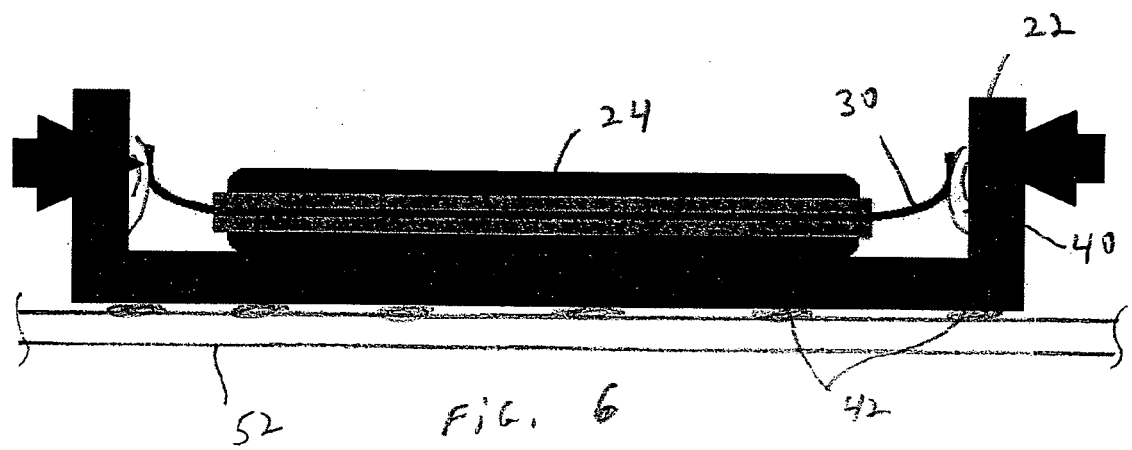

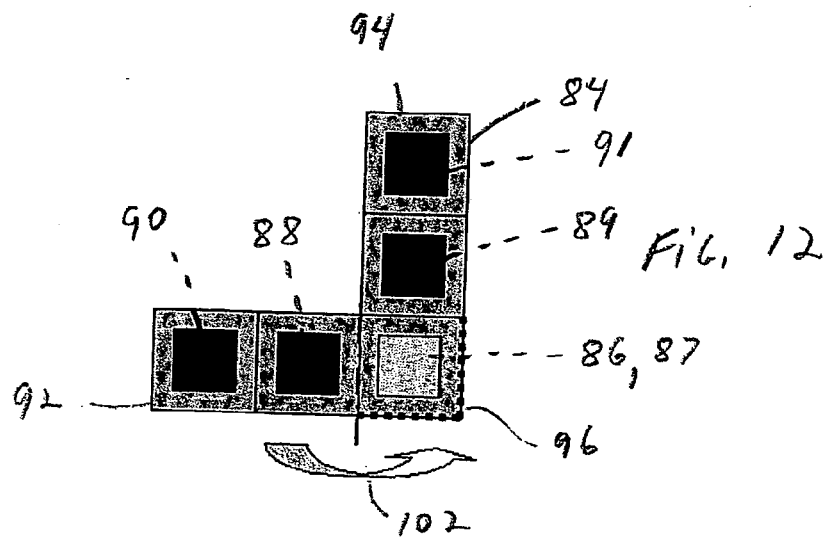
FIG. 12
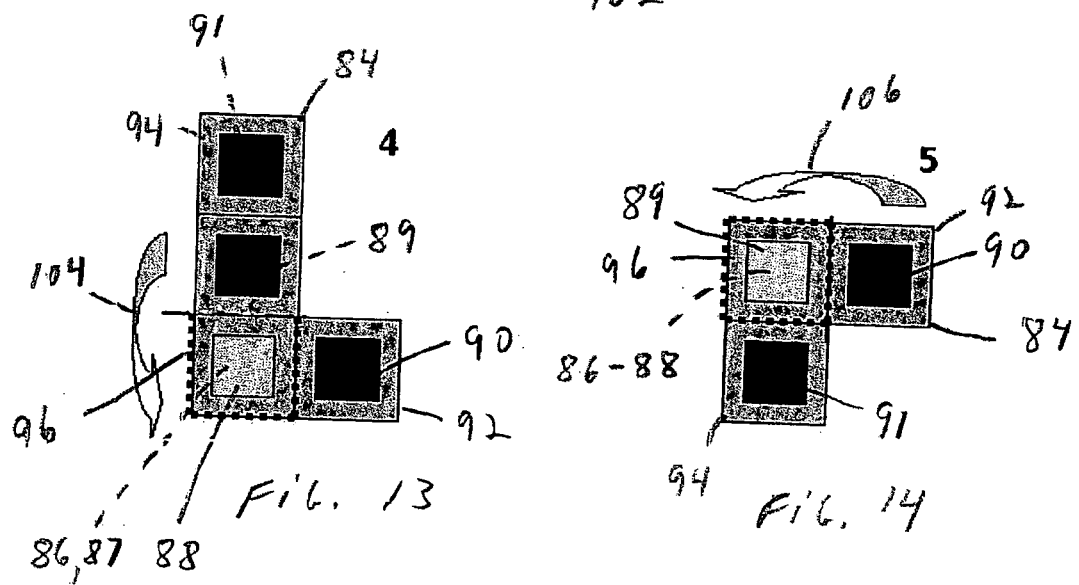
FIG. 13
FIG. 14
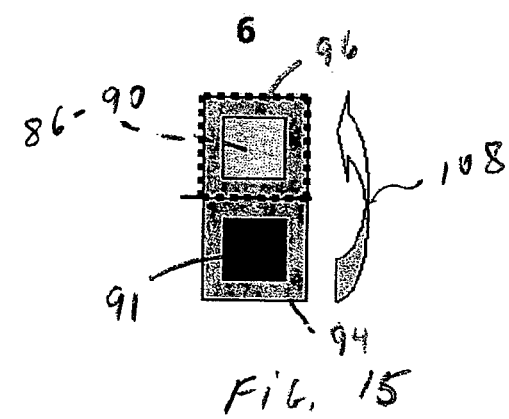
FIG. 15
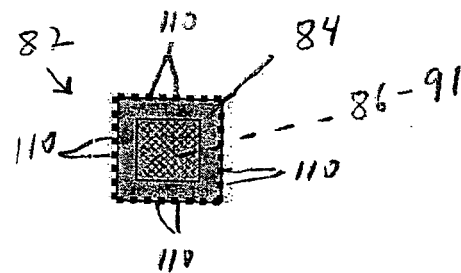
FIG. 16

ELECTRONIC COMPONENT ASSEMBLY

BACKGROUND OF THE INVENTION

1. Field of the Invention

The present invention relates to interconnection of electronic components and, more particularly, to an interconnection within an electronic package, which uses a flex cable, and electrical interconnection between components and assembly substrates.

2. Brief Description of Prior Developments

Flex cables, such as flat flexible cables (FFC) and flexible printed circuits (FPC) are generally well know. Currently the most typical interconnection method between electronics packages and motherboards is ball grid array (BGA) or land grid array (LGA) type of solderable interconnection. In large modules (containing a lot of functionalities and components) usage of this interconnection method set demands for motherboard technology selection (e.g. wiring of the module requires micro via technology in motherboard).

Referring to FIG. 1, there is shown a side view of an electronic component assembly 10 known in the prior art. The assembly 10 generally comprises a substrate 12, a plurality of electronic components 14, 15, and fusible elements 16. The electronic components 14, 15 are electrically connected to the fusible elements 16 by conductive paths (not shown) on and/or through the substrate 12. The fusible elements 16 can provide a soldered ball grid array (BGA) or land grid array (LGA) interconnection. These types of array interconnections are currently a very typical interconnection method for connecting complicated electronics packages in applications, such as a microprocessor to another component (for example). One problem which exists with BGA or LGA interconnections is that components cannot be assembled on the bottom side of the module; the side which comprises the fusible elements 16. Thus, the electronic components 14, 15 can be mounted on only the top side 18 of the substrate 12.

Another typical or conventional method of interconnection comprises a board edge plating process. Board edge plating processes are used in existing printed wiring board technology. Electrical contact interconnection areas are formed on lateral side edges of a rigid printed circuit board by a plating process. This type of manufacturing process is difficult and does not always provide an accurate process.

Due to limitations of single sided component assembly on the module, the total area (physical size of the module) is larger than it could be if a double-sided component assembly were used on a physical module. This is solved by improving component assembly processes with the present invention. An example of these are shrinkage of component-to-component spacing rules and usage of smaller component packages in assembly lines. This adds unnecessary complexity to the module electronics manufacturing processes.

SUMMARY OF THE INVENTION

In accordance with one aspect of the present invention, an electronic component assembly is provided including an electrical connector and an electronic subassembly. The electrical connector has a housing with a receiving area, electrical contacts connected to the housing, and fusible elements. The electrical contacts include first electrical connection sections in the receiving area and second electrical connection sections proximate a first exterior side of the housing. The fusible elements are connected to the second electrical connection sections. The electronic subassembly includes a printed wiring assembly and electronic components connected to opposite sides of the printed wiring assembly. The printed wiring assembly includes a relatively rigid section with the electronic components connected thereto and a flex cable forming deflectable lateral side sections with contact areas contacting the first electrical connector sections of the electrical contacts.

In accordance with another aspect of the invention, an electronic component assembly is provided comprising a flex cable and a plurality of electronic components connected to the flex cable. The flex cable comprises a general folded shape with the electronic components arranged in a general stacked orientation. Portions of the flex cable at bent sections of the folded shape form lateral side contact areas for contacting electrical connection areas of another member.

In accordance with one method of the present invention, a method of assembling an electronic component assembly is provided comprising connecting an electrical connector to a first electronic component comprising fusing fusible elements of the electrical connector to the first electronic component; and inserting an electronic subassembly into the electrical connector, wherein the electronic subassembly comprises printed wiring assembly with a flex cable and second electronic components connected to the printed wiring assembly, wherein the flex cable forms lateral side sections with bent contact areas contacting contacts inside the electrical connector.

In accordance with another aspect of the present invention, a method of assembling an electronic component assembly is provided comprising connecting a plurality of electronic components to a flex cable; and folding the flex cable to arrange the electronic components in a general stacked orientation, wherein an exterior portion of the flex cable at a bend of the flex cable between the electronic components forms a contact area for electrically connecting the flex cable to another electronic component.

BRIEF DESCRIPTION OF THE DRAWINGS

The foregoing aspects and other features of the present invention are explained in the following description, taken in connection with the accompanying drawings, wherein:

FIG. 4 is a side view of a printed wiring assembly used in the subassembly shown in FIG. 3;

FIG. 5 is a sectional view of the electrical connector shown in FIG. 2;

FIG. 6 is a sectional view of the electrical component assembly shown in FIG. 2 attached to another member;

FIGS. 10–16 are top plan views showing steps used to form an alternate embodiment of the electronic subassembly shown in FIG. 9.

DETAILED DESCRIPTION OF THE PREFERRED EMBODIMENTS

Figure 1:
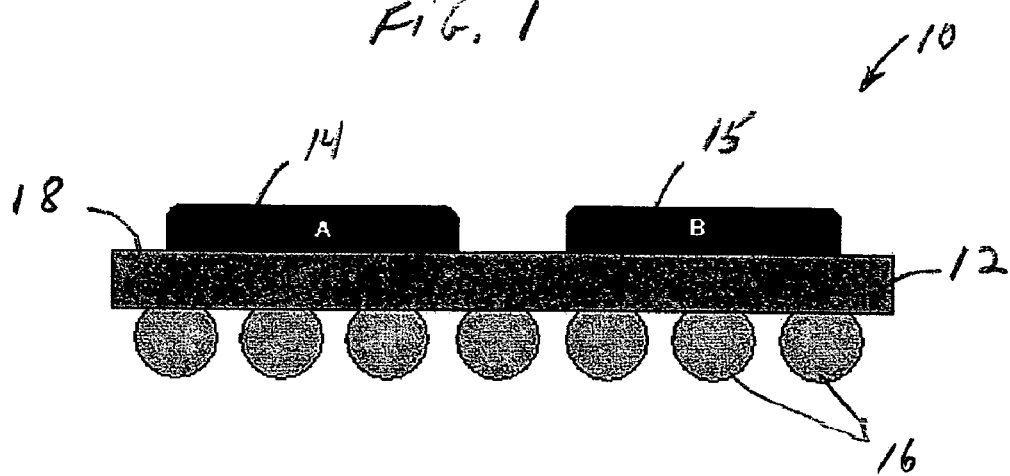
FIG. 1 is a side view of a conventional electronic component assembly.
Figure 2:
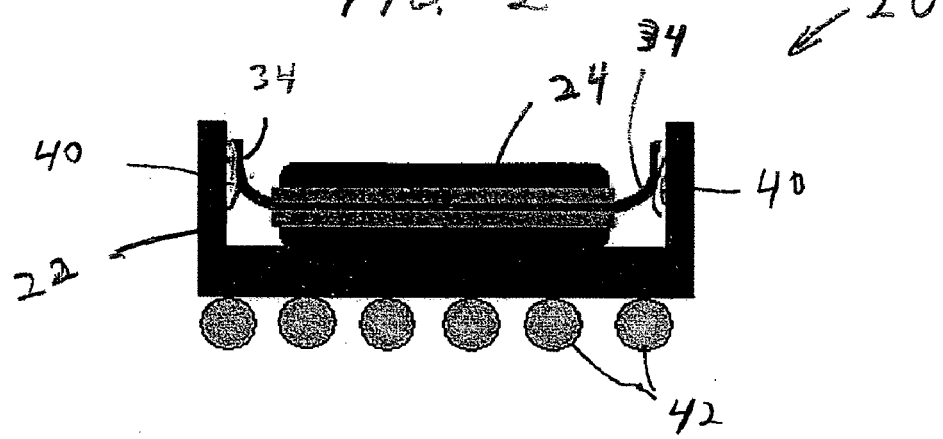
FIG. 2 is a sectional view of an electronic component assembly incorporating features of the present invention.

Referring to FIG. 2, there is shown a schematic sectional view of an electronic component assembly 20 incorporating features of the present invention. Although the present invention will be described with reference to the exemplary embodiments shown in the drawings, it should be understood that the present invention can be embodied in many alternate forms of embodiments. In addition, any suitable size, shape or type of elements or materials could be used.

Figure 3:
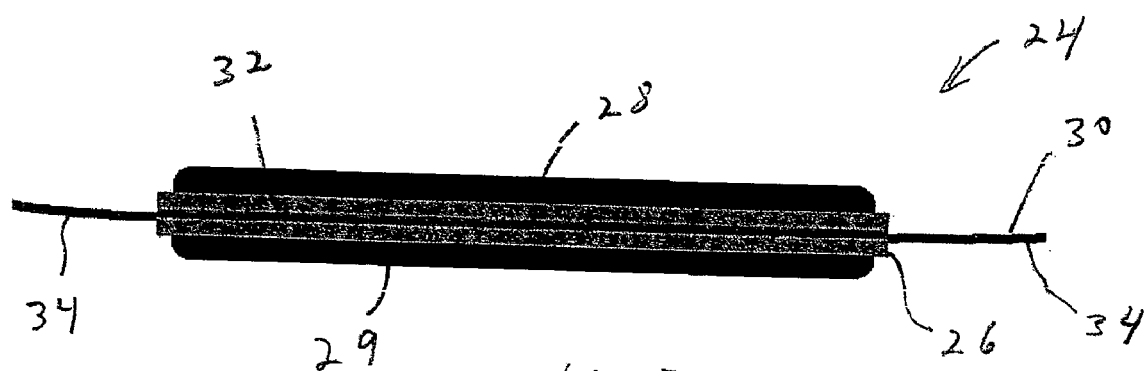
FIG. 3 is a side view of an electronic subassembly used in the assembly shown in FIG. 2.

The electronic component assembly 20 generally comprises an electrical connector 22 and an electronic subassembly 24. Referring also to FIGS. 3 and 4, the electronic subassembly 24 generally comprises a printed wiring assembly 26 and electronic components 28, 29, such as integrated circuits. In alternate embodiments, more than two electronic components could be provided on the printed wiring assembly 26. The printed wiring assembly 26 comprises a flex cable 30 and a relatively rigid section 32. In the embodiment shown, the relatively rigid section 32 is located on top and bottom sides of the flex cable 30. The flex cable 30 has lateral side sections 34 which extend outward past the sides of the rigid section 32. The flex cable 30 comprises electrical conductors on a flexible electrically insulating substrate. The conductors of the flex cable 30 are electrically connected to conductors on the rigid section 32, or are located at holes through the rigid section 32 which are adapted to receive conductors of the electronic components 28, 29. Thus, the conductors of the flex cable 30 are electrically connected to the contacts of the electronic components 28, 29 at the rigid section 32. The electrical conductors of the flex cable 30 extend along the lateral side sections 34 and are preferably exposed along at least the bottom sides 36 of the lateral side sections 34.

The rigid section 32 could be comprised of any suitable type of printed wiring member, such as two thin printed circuit boards, for example. The rigid section 32 preferably sandwiches the middle section of the flex cable 30 therein. When the printed wiring assembly 26 is formed, the rigid section 32 and flex cable 30 are preferably formed into a unitary one piece structure. As used herein, this combined flexible substrate and rigid or semi-rigid substrate configuration is referred to as a "flex-rigid printed wiring board" technology. The printed wiring assembly 26 functions as an interposer between the electronic components 28, 29 and the electrical connector 22. The electronic components 28, 29 are stationarily attached to the printed wiring assembly 26 at the top and bottom sides of the rigid section 32. The electronic components 28, 29 are preferably attached to the printed wiring assembly 26 after the printed wiring assembly is formed. However, in an alternate embodiment, the electronic components 28, 29 could be attached to the rigid section(s) 32 prior to connection of the rigid section with the flex cable 30.

Figure 7:
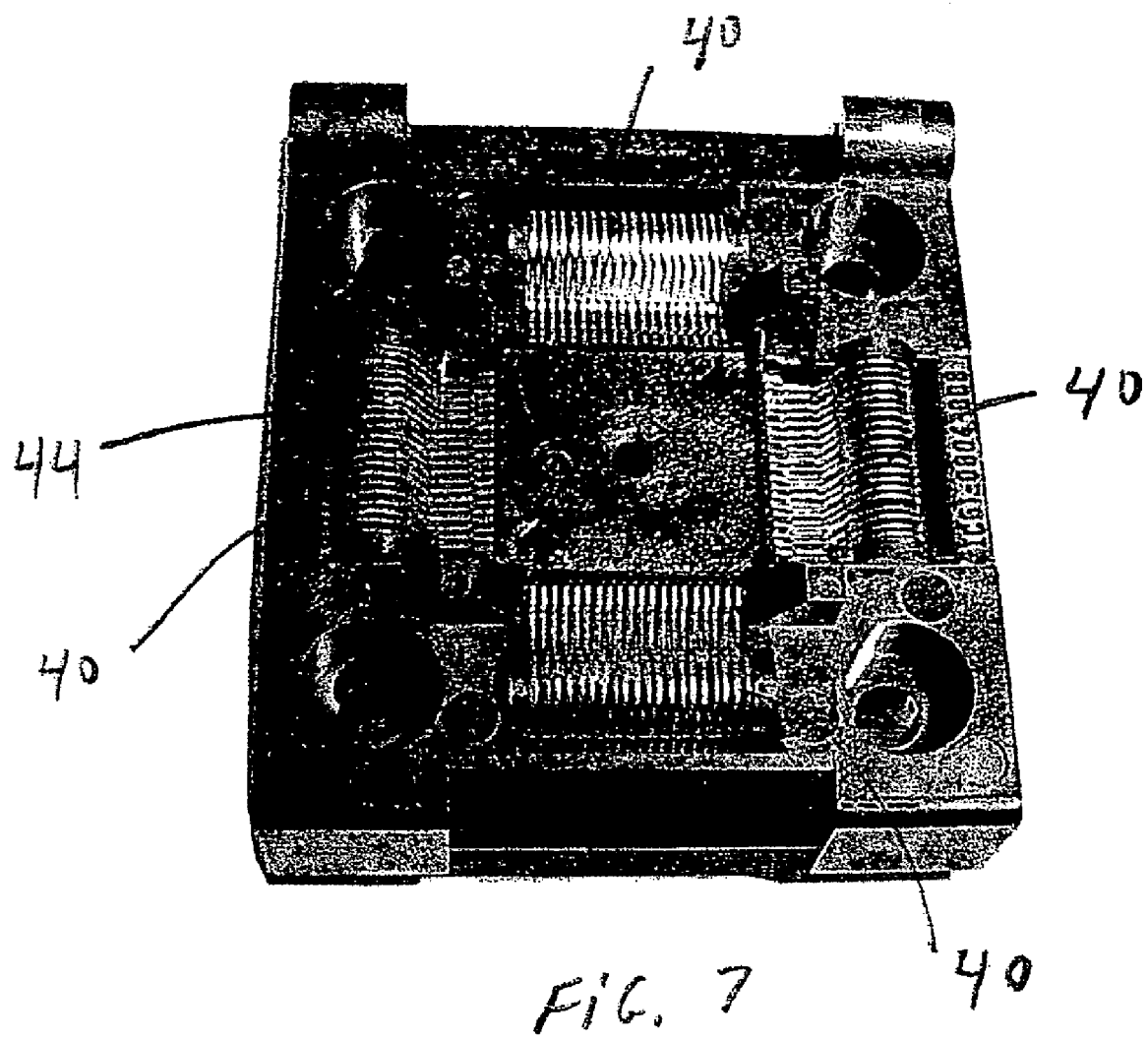
FIG. 7 is a top view of one embodiment of the electrical connector shown in FIGS. 2, 5 and 6.

Referring also to FIG. 5, the electrical connector 22 generally comprises a housing 38, electrical contacts 40 and fusible elements 42. The housing 38 comprises a receiving area 44. The receiving area extends into the housing from a second side of the housing opposite the first side 50. The electrical contacts 40 are mounted to the housing 38. The electrical contacts 40 comprise first electrical connection sections 46 which extend into the receiving area 44. More specifically, the first electrical connection sections 46 extend into the receiving area 44 from lateral sides of the receiving area. The first electrical connection sections 46 can comprise deflectable spring sections. Alternatively, the first electrical connection sections 46 could comprise stationary contact areas. The electrical contacts 40 also comprises second electrical connection sections 48 proximate a first exterior side 50 of the housing 38. The fusible elements 42 are mounted on the second electrical connection sections 48. FIG. 7 shows a top view of one embodiment of the electrical connector 22 having a square shaped receiving area 44 and four arrays of the electrical contacts 40 located on the four sides of the receiving area. The embodiment shown in FIG. 7 is merely one example of how the receiving area could be shaped and the electrical contacts arranged relative to that shape. In alternate embodiments, the receiving area could comprise any suitable type of shape including round or polygonal.

As seen in FIG. 2, the electronic subassembly 24 is adapted to be inserted into the receiving area 44 of the electrical connector 22. The length and/or width of the electronic subassembly 24 is larger than the length and/or width of the receiving area 44. As the subassembly 24 is inserted into the receiving area 44 the lateral side sections 34 are bent or deform. This causes the electrical conductors on the bottom sides 36 of the lateral side sections 34 to come into contact with the first electrical connection sections 46 of the electrical contacts 40. This electrical connection provides an electrical connection between the electronic components 28, 29 of the subassembly 24 with the fusible elements 42.

As seen in FIG. 6, the fusible elements 42 are melted when the electrical connector 22 is electrically connected to another member 52, such as a printed circuit board, for example. In a preferred method of the present invention, the electrical connector 22 is connected to the member 52 before the electronic subassembly 24 is connected to the electrical connector. Thus, the subassembly 24 can be connected to the member 52 after the fusible elements 42 have been melted. This reduces the exposure of the subassembly 24 to the heat required to melt the fusible elements 42. After the subassembly 24 is connected to the electrical connector 22 a suitable device or system could be used to prevent the subassembly 24 from subsequently unintentionally moving relative to the electrical connector. For example, a potting material or adhesive could the inserted into the receiving area 44. As another example, a cover could be located on top of the subassembly 24 and stationarily attached to the connector 22 to prevent the subassembly 24 from moving. Suitable guides, registrations, or fixation means could be used to prevent misalignment of the conductors on the flex cable 30 with the electrical connectors 40. The lateral side sections 34 of the flex cable 30 preferably comprise suitable rigidity, in view of the limited space for bending, to resiliently bend and exert a suitable biasing force against the contacts 40 to retain the conductors of the flex circuit against the contacts 40, and provide a frictional force to at least partially retain the subassembly inside the retaining area 44.

Figure 8:
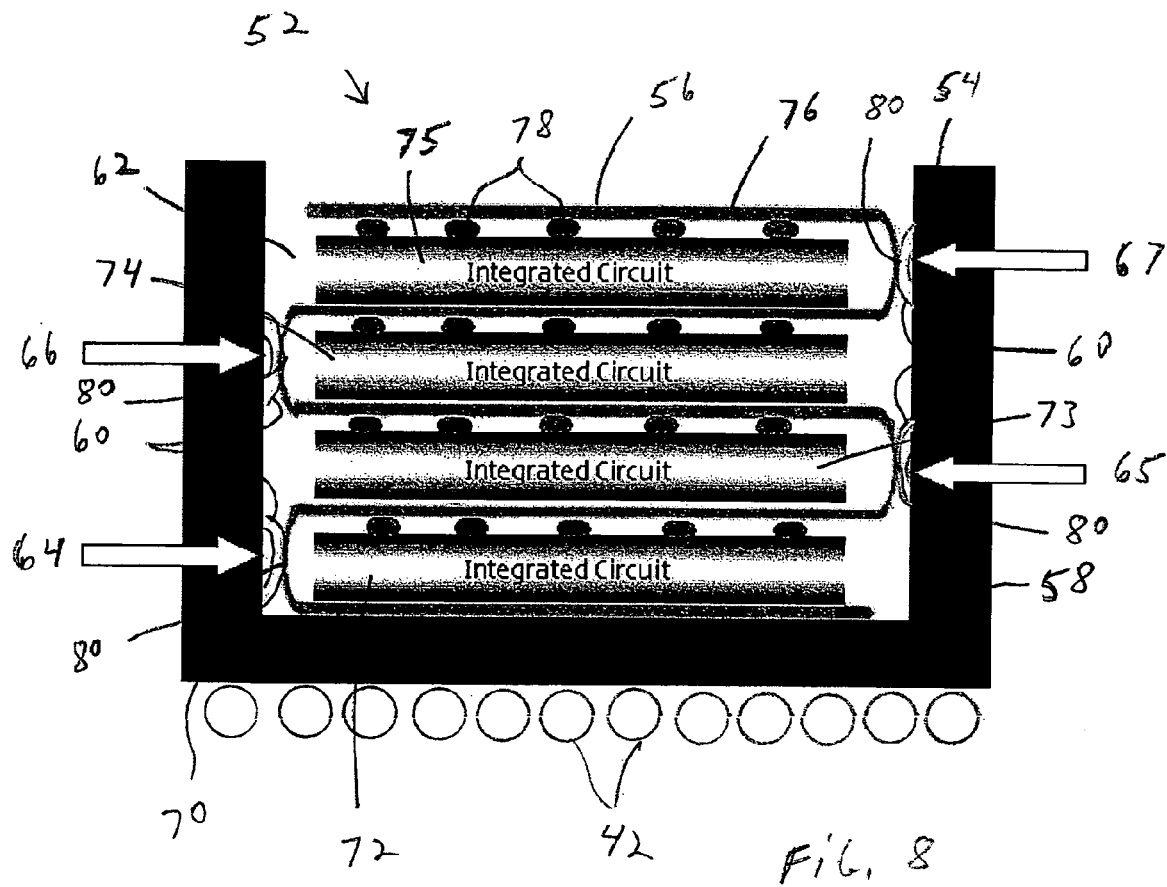
FIG. 8 is a sectional view of an alternate embodiment of the present invention.
Figure 9:
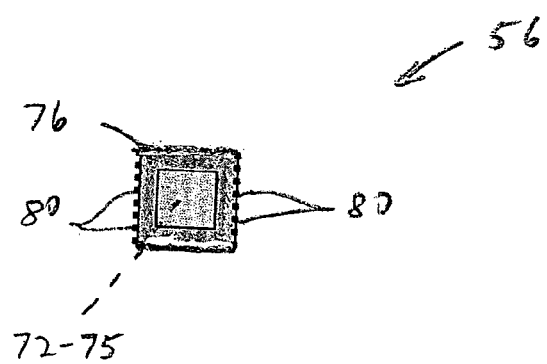
FIG. 9 is a top plan view of the electronic subassembly shown in FIG. 8.

Referring now to FIG. 8, an alternate embodiment of the present invention is shown. The electronic component assembly 52 generally comprises an electrical connector 54 and an electronic subassembly 56. The electrical connector 54 generally comprises a housing 58, electrical contacts 60 and fusible elements 42. The housing 58 comprises a receiving area 62. The electrical contacts 60 are mounted to the housing 58. The electrical contacts 60 comprise four levels 64, 65, 66, 67 of first electrical connection sections 68 which extend into the receiving area 62. More specifically, the first electrical connection sections 68 extend into the receiving area 62 from lateral sides of the receiving area. The first electrical connection sections 68 can comprise deflectable spring sections. Alternatively, the first electrical connection sections 68 could comprise stationary contact areas. The electrical contacts 60 also comprises second electrical connection sections proximate a first exterior side 70 of the housing 58. The fusible elements 42 are mounted on the second electrical connection sections. In an alternate embodiment, the electrical connector 54 might not comprise fusible elements 42. Instead, second ends of the electrical contacts 60 could comprise solder tales such as through-hole solder tales or surface mount solder tales.

The subassembly 56 comprises multiple electronic components or devices 72, 73, 74, 75 and a flex cable 76. In alternate embodiments, more or less than four components could be used. The components 72–75 are electrically and mechanically attached to the flex cable 76 at connections 78. Any suitable type of connection could be used for the connections 78. The electronic components 72–75 could comprise any suitable type of electronic component such as an integrated circuit for example. The flex cable 76 has a general folded shape with the electronic components 72–75 arranged in a general stacked orientation. The flex cable 76 comprises electrical conductors which form portions of the flex cable at the bent sections of the folded shape to form lateral side contact areas 80 which contact the electrical connection areas of the electrical contacts 60. The bent lateral side sections of the flex cable 76 comprise suitable rigidity, in view of the limited space for bending, to resiliently bend and exert a suitable biasing force against the contacts 60 to retain the conductors of the flex circuit against the contacts 60, and provide a frictional force to at least partially retain the subassembly inside the receiving area 62. The top sides of the electronic components 72–75 (i.e., the sides of the electronic components located opposite their respective connections 78) can be placed against a side of the flex circuit 76 in this sandwiched configuration.

Referring now also to FIGS. 10–16, one method of forming an alternate embodiment of the subassembly will be described. FIG. 16 shows a top plan view of the subassembly 82. In this embodiment, the subassembly 82 comprises a single flex cable 84 and a plurality of electronic components 86–91. The flex cable 84 has been folded to arrange the electronic components 86–91 in a general stacked figuration. FIGS. 10–15 show, respectively, the steps used to fold the flex cable 84 to form the subassembly 82.

Figure 10:
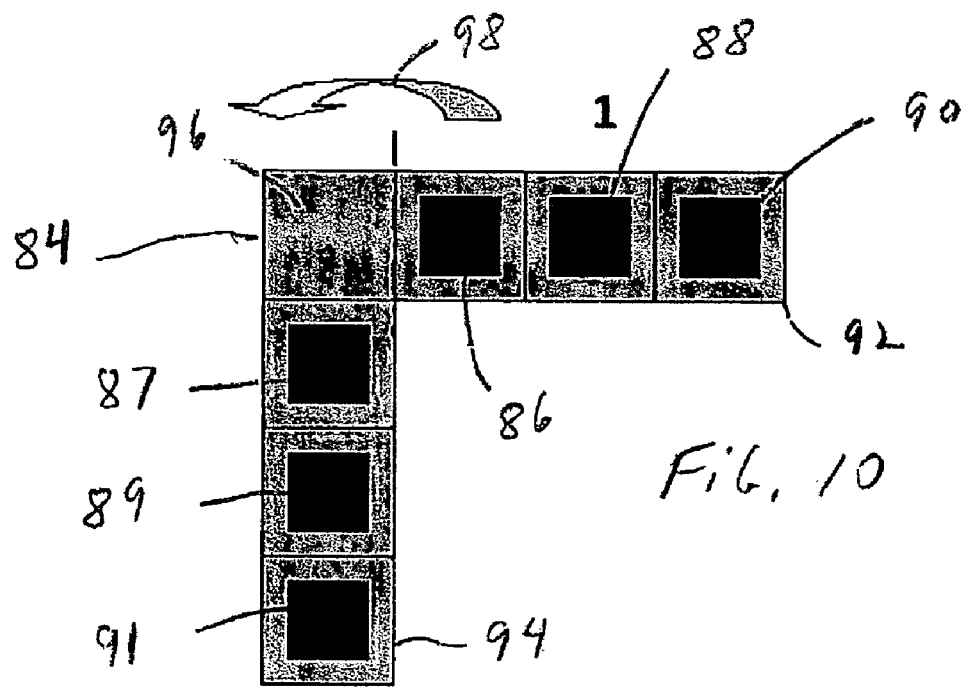

FIG. 10 shows the flex cable 84 before the flex cable 84 is folded. Electronic components 86–91 are arranged in two orthogonal rows and mounted to a same side of the flex cable 84. In an alternate embodiment, the electronic components could be mounted to more than the same side. In addition, more than two rows could be provided. The flex cable 84 comprises a general L shape with two orthogonal leg sections 92, 94. In alternate embodiments, a "T" shape, or single row "I" shape, or a "+" shape could be provided. These are only some examples. Any suitable shapes prior to folding of the flex circuit could be provided.

Figure 11:
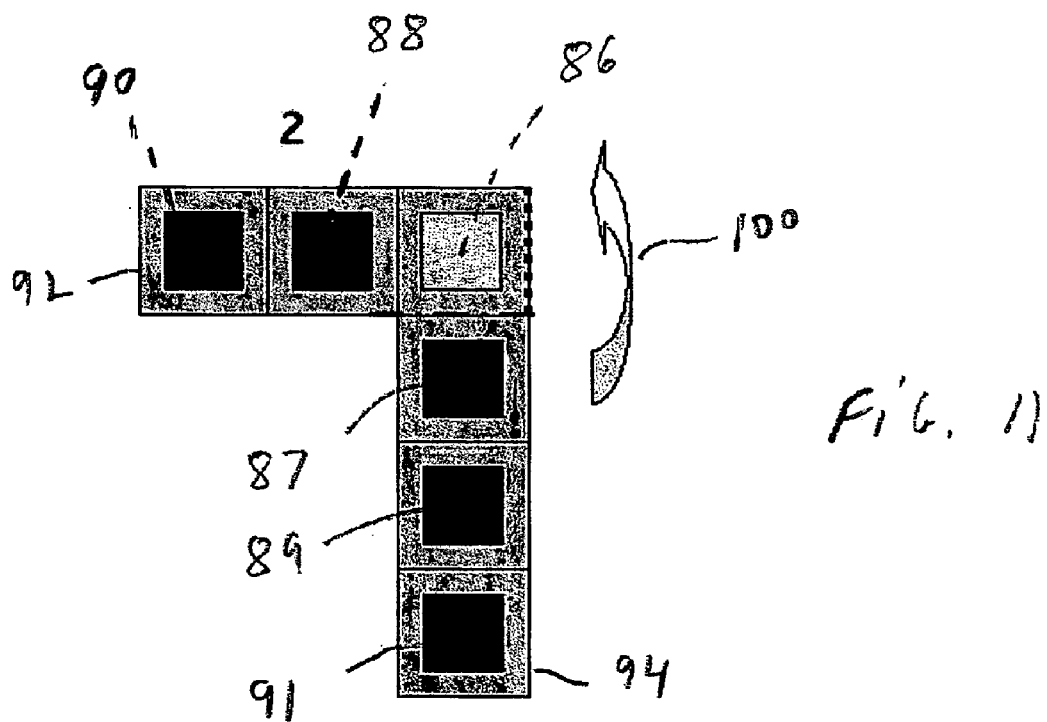

Comparing FIG. 10 to FIG. 11, the first leg section 92 is folded over a center section 96 as indicated by arrow 98. This locates the first electronic component 86 over the center section 96 as seen in FIG. 11. Referring also to FIG. 12, the second leg section 94 is then folded over the center section 96 as indicated by arrow 100. This locates the second electronic component 87 over the center section 96. Referring also to FIG. 13, the first leg section 92 is then folded over the center section 96 as indicated by arrow 102. This locates the third electronic component 88 over the center section 96. Referring also to FIG. 14, the second leg section 94 is then folded over the center section 96 as indicated by arrow 104. This locates the fourth electronic component 89 over the center section 96. Referring also to FIG. 15, the first leg section 92 is then folded over the center section 96 as indicated by arrow 106. This locates the fifth electronic component 90 over the center section 96. Referring finally also to FIG. 16, the second leg section 94 is then folded over the center section 96 as indicated by arrow 108. This locates the sixth electronic component 91 over the center section 96.

With this type of arrangement, the flex cable 84 forms connection sections 110 at the four sides of the subassembly 82 at the bends of the flex cable 84. The connection sections 110 are located at different heights or levels of the subassembly and can be subsequently connected to contacts of an electrical connector or equivalent connection system. The folding order can allow substantially simultaneous interconnection of contact surfaces located on the package edge.

The present invention can provide easier rework of the assembly after sale. In service (in the other words after the initial sale), service personnel can just pull out the damaged component from the socket and replace it with a new one without using any soldering. This provides a fast, simple and straightforward service or rework process. This invention can improve protection against physical damages of the electronic components by locating the electronic components inside the housing of the electrical connector as well as at least partially surrounded by the flex circuit. If solder ball connections are used with the electrical connector to another electronic device, such as a mother printed circuit board, the electronic components do not need to be soldered which enables avoiding heat treatments for the electronic components during their production. The subassembly can be pushed into a receiving socket electrical connector in a relatively simple and fast assembly.

Principles of physical modularity are getting more popular in the field of electronics. Usage of conventional interconnection methods between component packages/physical modules and motherboards set limitations for effective usage of module area. One limitation is that components can be added only on one side of the physical module substrate. To solve that limitation, the interconnections of the present invention are provided on physical module's edge area. This enables double sided component assembly on the module. This provides a possibility to shrink the size of the module.

Electronics miniaturization requires multiple integrated circuits assembled into one component package. For BGA interconnections, an increased number of input/output signals force manufacturers to implement and introduce higher BGA pin densities for component packages. This adds special demands for application motherboard technologies and thereby adds cost into all electronics applications. To solve that limitation, the interconnections of the present invention are at least partially provided on component packages edge area(s). This enables smaller physical dimensions for component packages without cost penalty for motherboard technologies.

The present invention provides an interconnection method in-between physical modules and electronics enabling double sided component assembly of the physical modules. The present invention provides interconnections of the module on the edges of the device. The present invention enables double sided component assembly in the module. The interconnections can be produced with flex or flex-rigid PWB technology. There is no need for complicated board-edge plating technologies commonly used in PWB manufacturing. For the socket on the motherboard, intelligent board-to-board connector can be provided because the solution does not waste module surface area.

The present invention enables a smaller total size for physical modules and more functionalities to existing area. The present invention can provide smaller size for physical modules due to double-sided component assembly for the module. The present invention can provide the possibility to simplify motherboard technology. With the present invention, there is easier rework of application in after sales. The module is possible to be disassembled from socket without any soldering. The present invention improves protection against physical damages and dust in the case of a socket which can be closed. The Module electronics can be sealed inside of the socket. There is also the possibility to improve Electro Static Discharge (ESD) and Electro Magnetic Charge (EMC) protection with shielding construction added into socket.

The present invention can enable higher Integrated Circuit (IC) count for components packages within a same physical dimensions (more functionalities to existing area). The present invention can avoid the component going through high temperature soldering process. The present invention can use a Lead Free soldering process which is about to be legislated in Europe in the near future. Soldering process heat profile can be higher than conventional ones. More demanding heat treatment for electronics during assembly can be provided.

The present invention can provide an interconnection method in-between component packages containing multiple integrated circuits and an assembled application. The present invention can provide interconnections of the component on the edges of the device. The present invention can provide interconnections between integrated circuits which can be done within the component package by using a high-density flex interposer. This enables less I/O's for a component itself. This then leads to low-density need in motherboard technology. The present invention can provide interconnections between a component and a socket produced with flex PWB technology. Interconnections between a socket and a motherboard can be done by using conventional gull-wing leads (such as Thin Quad Flat Package (TQFP) packages are using). Usage of a flex cable enables bendable package philosophy and the possibility to locate interconnection surfaces in multiple levels on package edges without extra cost. Customized socket on the motherboard can be provided for an intelligent component-to-board connector.

Figure 17:
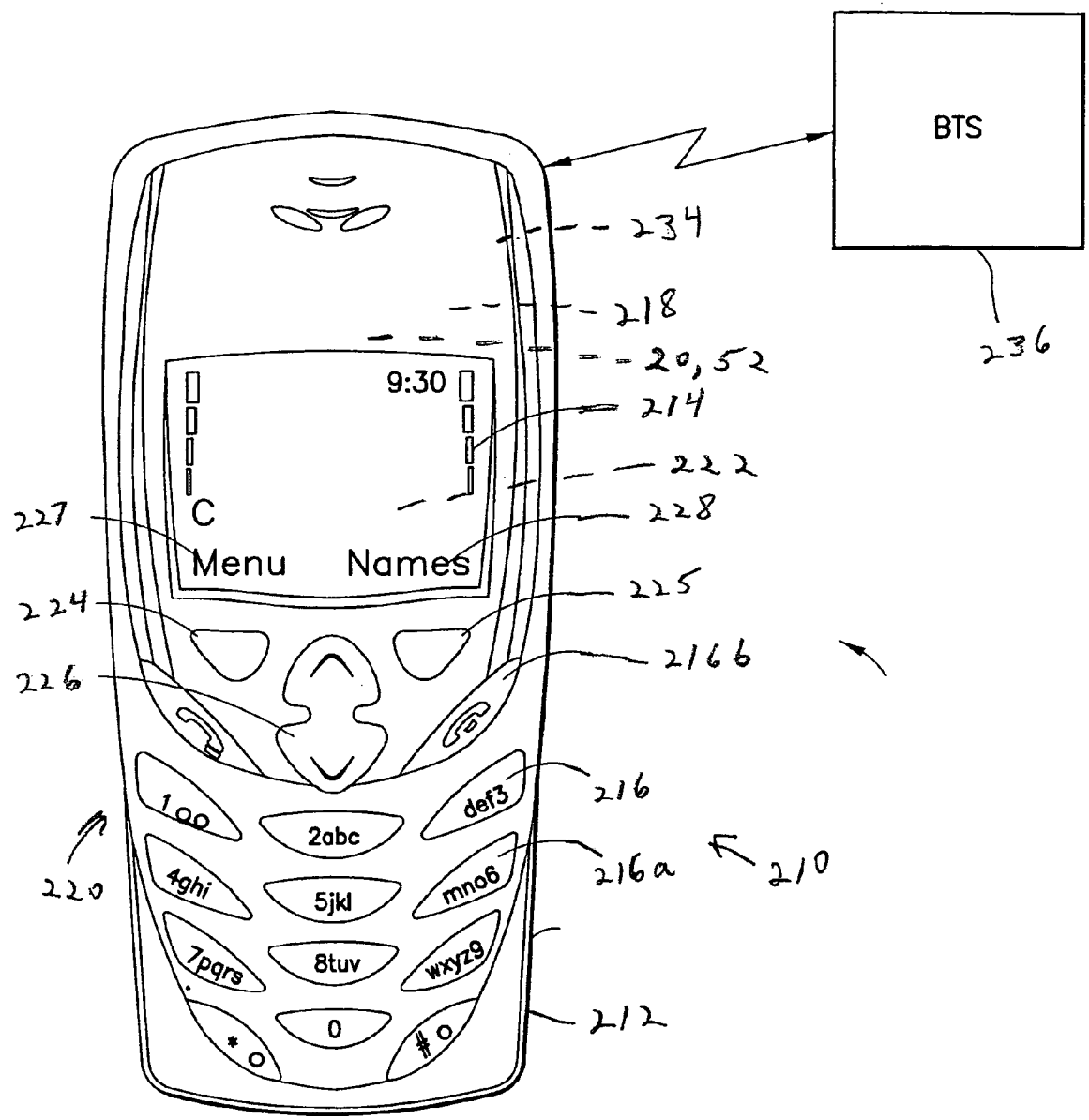
FIG. 17 is a diagram showing use of an assembly of the present invention in one embodiment of a portable handheld electronic device.

Referring also to FIG. 17, one example of a hand-held mobile communications device or mobile station 210 is shown which can include a component assembly of the present invention. In alternate embodiments, the component assembly could be used in any suitable device. The mobile station 210 typically includes a housing 212, a user interface (UI) 220, and electronic circuitry 222 connected to the user interface and located inside the housing. The electronic circuitry can comprise a micro control unit (MCU) having an output coupled to an input of a display 214 and an input coupled to an output of a keyboard or keypad 216 of the user interface. The electronic circuitry comprises the assembly of the present invention, such as 20 or 52.

The mobile station 210 may be considered to be a hand-held radio telephone, such as a cellular or mobile telephone, or a personal communicator, or a PDA, or a gaming device, and may have a microphone and a speaker for conducting voice communications. The mobile station 210 could also be contained within a card or module that is connected during use to another device. For example, the mobile station 210 could be contained within a PCMCIA or similar type of card or module that is installed during use with a portable data processor, such as a laptop or notebook computer, or even a computer that is wearable by the user.

The MCU is assumed to include or be coupled to some type of memory, including a read only memory (ROM) for storing an operating program, as well as a random access memory (RAM) for temporarily storing require data, scratchpad data memory, received data packets and data packets prepared for transmission, etc. A separate removable SIM (not shown) can be provided as well. The SIM could store, for example, a preferred public land mobile network (PLMN) list and other subscriber related information.

The mobile station 210 also contains a wireless section that includes a digital signal processor (DSP), or equivalent high-speed processor, as well as a wireless radio frequency (RF) transceiver 218 comprising a transmitter and a receiver. The transceiver is coupled to an antenna 234 for communication with a network operator via a base station 236. In an alternate embodiment, features of the present invention could be used with any suitable type of wireless communications device or mobile phone.

As seen in FIG. 17, the keypad 216 includes an alphanumeric key section 216a and a control key section 216b. The control key section of 216b includes two soft keys 224, 225 and an up/down scroll key 226. However, in alternate embodiments, the control key section could be comprised of any suitable number or type of keys or cursor control device. The two soft keys 224, 225 are located beneath two control indicator sections 227, 228 of the display 214. When one of the soft keys 224, 225 are depressed, the controller can perform the menu function listed in the control indicator section 227, 228 located above the depressed soft key.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electronic component assembly comprising:
    an electrical connector having a housing with a receiving area, electrical contacts connected to the housing, and fusible elements, wherein the electrical contacts comprise first electrical connection sections in the receiving area and second electrical connection sections proximate a first exterior side of the housing, and wherein the fusible elements are connected to the second electrical connection sections; and
    an electronic subassembly connected to the electrical connector, the electronic subassembly comprising a printed wiring assembly and electronic components connected to opposite sides of the printed wiring assembly, wherein the printed wiring assembly comprises a relatively rigid section with the electronic components connected thereto and a flex cable forming deflectable lateral side sections with contact areas contacting the first electrical connector sections of the electrical contacts.

2. An electronic component assembly as in claim 1 wherein the electronic components comprise a integrated circuit chip.

3. An electronic component assembly as in claim 1 wherein the first electrical connection sections of the contacts comprise deflectable spring contact sections.

4. An electronic component assembly as in claim 1 wherein the receiving area extends into a second side of the housing opposite the first side of the housing.

5. An electronic component assembly as in claim 1 wherein the first electrical connection sections of the contacts extend into the receiving area from lateral sides of the receiving area.

6. An electronic component assembly as in claim 1 wherein the deflectable lateral side sections of the flex cable are resiliently reflected by the electrical connector when the electronic subassembly is inserted into the receiving area, and wherein the flex cable exerts a biasing force against the first electrical connection sections.

* * * * *

UNITED STATES PATENT AND TRADEMARK OFFICE
CERTIFICATE OF CORRECTION

PATENT NO. : 7,172,454 B2  
APPLICATION NO. : 11/026902  
DATED : February 6, 2007  
INVENTOR(S) : Tero Kalevi Karkkainen and Kalle Salokannel Page 1 of 1

It is certified that error appears in the above-identified patent and that said Letters Patent is hereby corrected as shown below:

Col. 10, Claim 7 should read as follows:

7. A hand-held mobile electronic device comprising:
a housing;
a user interface (UI) section on the housing; and
electronic circuitry inside the housing and coupled to the user interface, wherein the electronic circuitry comprises an electronic component assembly comprising:
an electrical connector having a housing with a receiving area, electrical contacts connected to the housing, and fusible elements, wherein the electrical contacts comprise first electrical connection sections in the receiving area and second electrical connection sections proximate a first exterior side of the housing, and wherein the fusible elements are connected to the second electrical connection sections; and
an electronic subassembly connected to the electrical connector, the electronic subassembly comprising a printed wiring assembly and electronic components connected to the printed wiring assembly, wherein the printed wiring assembly comprises at least one relatively rigid section with the electronic components connected thereto and at least one flex cable forming at least one deflectable lateral side section with contact areas contacting the first electrical connector sections of the electrical contacts.

Signed and Sealed this

Twenty-second Day of July, 2008

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,172,454 B2 | Page 1 of 1 |
| APPLICATION NO. | : 11/026902 | |
| DATED | : February 6, 2007 | |
| INVENTOR(S) | : Tero Kalevi Karkkainen and Kalle Salokannel | |

It is certified that error appears in the above-identified patent and that said Letters Patent is hereby corrected as shown below:

Col. 10, line 5 Claim 7 add:

7. A hand-held mobile electronic device comprising:
a housing;
a user interface (UI) section on the housing; and
electronic circuitry inside the housing and coupled to the user interface, wherein the electronic circuitry comprises an electronic component assembly comprising:
an electrical connector having a housing with a receiving area, electrical contacts connected to the housing, and fusible elements, wherein the electrical contacts comprise first electrical connection sections in the receiving area and second electrical connection sections proximate a first exterior side of the housing, and wherein the fusible elements are connected to the second electrical connection sections; and
an electronic subassembly connected to the electrical connector, the electronic subassembly comprising a printed wiring assembly and electronic components connected to the printed wiring assembly, wherein the printed wiring assembly comprises at least one relatively rigid section with the electronic components connected thereto and at least one flex cable forming at least one deflectable lateral side section with contact areas contacting the first electrical connector sections of the electrical contacts.

This certificate supersedes the Certificate of Correction issued July 22, 2008.

Signed and Sealed this

Twenty-third Day of December, 2008

JON W. DUDAS
*Director of the United States Patent and Trademark Office*